United States Patent
Xu et al.

(10) Patent No.: US 9,608,118 B2
(45) Date of Patent: Mar. 28, 2017

(54) ARRAY SUBSTRATE, DISPLAY DEVICE AND MANUFACTURING METHOD OF ARRAY SUBSTRATE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xiangyang Xu, Beijing (CN); Lei Du, Beijing (CN); Sheng Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 15 days.

(21) Appl. No.: 14/367,367

(22) PCT Filed: Dec. 3, 2013

(86) PCT No.: PCT/CN2013/088420
§ 371 (c)(1),
(2) Date: Jun. 20, 2014

(87) PCT Pub. No.: WO2015/000256
PCT Pub. Date: Jan. 8, 2015

(65) Prior Publication Data
US 2015/0021612 A1    Jan. 22, 2015

(30) Foreign Application Priority Data

Jul. 5, 2013   (CN) .......................... 2013 1 0282242

(51) Int. Cl.
*H01L 29/786*    (2006.01)
*H01L 27/12*    (2006.01)

(52) U.S. Cl.
CPC ...... *H01L 29/78606* (2013.01); *H01L 27/124* (2013.01)

(58) Field of Classification Search
CPC ........................ H01L 27/124; H01L 29/78606
See application file for complete search history.

(56) References Cited

U.S. PATENT DOCUMENTS

2005/0077517 A1   4/2005  Chang et al.
2009/0128768 A1*  5/2009  Kar-Roy ........... G02F 1/136277
                                                    349/155
(Continued)

FOREIGN PATENT DOCUMENTS

CN          1607442 A     4/2005
CN        101852953 A    10/2010
(Continued)

OTHER PUBLICATIONS

Second Chinese Office Action Appln. No. 201310282242.X; Dated Mar. 26, 2015.
(Continued)

*Primary Examiner* — Zandra Smith
*Assistant Examiner* — Lauren R Bell
(74) *Attorney, Agent, or Firm* — Ladas & Parry LLP

(57) ABSTRACT

An array substrate, a display device and a method of producing the array substrate are provided, and the array substrate includes a substrate and a thin film field effect transistor and a data line formed on the substrate, and the thin film field effect transistor includes a gate electrode, an active layer, a source electrode and a drain electrode, a gate insulating layer is formed between the gate electrode and the active layer, and the array substrate includes: a protection layer formed between the gate insulating layer and the data line and being in direct contact with the data line; and the (Continued)

protection layer is provided on the same layer with and has the same material with the active layer.

15 Claims, 2 Drawing Sheets

(56) References Cited

U.S. PATENT DOCUMENTS

| | | | | |
|---|---|---|---|---|
| 2009/0230402 | A1* | 9/2009 | Lee | H01L 27/12 257/72 |
| 2010/0245700 | A1 | 9/2010 | Zhao et al. | |
| 2012/0113341 | A1* | 5/2012 | Uochi | G02F 1/136213 349/38 |
| 2012/0188478 | A1* | 7/2012 | Kuwabara | H01L 27/1288 349/43 |

FOREIGN PATENT DOCUMENTS

| | | |
|---|---|---|
| CN | 102636927 A | 8/2012 |
| CN | 10279235 A | 10/2012 |
| CN | 102969361 A | 3/2013 |
| CN | 103337479 A | 10/2013 |
| CN | 203365871 U | 12/2013 |
| KR | 20050035676 A | 4/2005 |

OTHER PUBLICATIONS

Korean Examination Opinion dated Jun. 22, 2015; Appln. No. 10-2014-7018442.
International Search Report Appln. No. PCT/CN2013/088420; Dated Apr. 3, 2014.
First Chinese Office Action Appln. No. 201310282242.X; Dated Oct. 10, 2014.
Korean Office Action Appln. No. 10-2014-7018442; Dated Dec. 28, 2015.
International Preliminary Report on Patentability Appln. No. PCT/CN2013/088420; Dated Jan. 5, 2016.
Extended European Search Report dated Jan. 18, 2017; PCT/CN2013088420.

* cited by examiner

ARRAY SUBSTRATE, DISPLAY DEVICE AND MANUFACTURING METHOD OF ARRAY SUBSTRATE

TECHNICAL FIELD

Embodiments of the present invention relate to an array substrate, a display device, and a manufacturing method of the array substrate.

BACKGROUND

Flat panel display has replaced heavy CRT display and is increasingly going deep into people's daily life. Currently, common flat panel displays comprise an LCD (liquid crystal display) and an OLED (organic light-emitting diode) display. The above flat panel displays have features of small volume, low power consumption, no radiation and etc., and have played a leading role in current flat panel display market.

An array substrate is an important constituting part of a display, wherein a thin film field effect transistor (TFT) array substrate is a type of array substrate that is currently used widely. For the TFT array substrate, a TFT switch is usually constituted by a gate electrode, a source/drain electrode and an active layer connected with the source/drain electrode, and a barrier layer is provided on the active layer. During forming the source/drain electrode, the barrier layer is used to prevent the active layer from being destroyed and then to improve the performance of the TFT switch. A data line is usually provided on the same metal layer with the source/drain electrode, a gate line and the gate electrode are provided on the same metal layer, referring to the schematic diagram of the section at the overlapping position of the data line and the gate line shown in FIG. 1, it comprises a data line 1, a gate line 2, a gate insulating layer 3 and a barrier layer 4. The gate insulating layer 3 and the barrier layer 4 usually use SiOx or SiOx/SiNx which have poor compactness, thus, the contact face between the gate insulating layer 3 or the barrier layer 4 and the adjacent metal layer has a bubble-shaped gap (for example, between the data line 1 and the barrier layer 4 shown in FIG. 1), and during etching the data line, as the contact face between the barrier layer and the metal forming the data line has the bubble-shaped gap, an etching liquid will enter the contact face between the barrier layer and the data line via the bubble-shaped gap, so that the data line is eroded and then cracked. This defect is especially serious at a slope position which can be understood as a position at the gate insulating layer or barrier layer where height changes and which usually corresponds to the position of the gate electrode or gate line (for example, the gradient position 5 at the overlapping position of the data line 1 and the gate line 2 shown in FIG. 1, and the height changes from low to high to form a slope).

SUMMARY

One of the purposes of the present invention is to provide an array substrate, a display device and a manufacturing method of the array substrate, so as to solve the problem in the prior art that data line is easily cracked during etching the data line as the contact face between the barrier layer and the metal forming the data line has a bubble-shaped gap.

The embodiments of the present invention provide an array substrate comprising a substrate and a thin film field effect transistor (TFT) and a data line formed on the substrate, and the thin film field effect transistor comprises a gate electrode, an active layer, a source electrode and a drain electrode, a gate insulating layer is formed between the gate electrode and the active layer, and the array substrate further comprises: a protection layer formed between the gate insulating layer and the data line and being in direct contact with the data line; and the protection layer is provided on the same layer with and has the same material with the active layer.

In one example, the protection layer is ZnO, InZnO, ZnSnO, GaInZnO or ZrInZnO.

In one example, the thickness of the protection layer is 200 Å-2000 Å.

In one example, the thin film field effect transistor is a bottom gate type thin film field effect transistor.

In one example, the array substrate further comprises a barrier layer formed on the active layer and on the gate insulating layer outside the protection layer.

In one example, the array substrate further comprises a pixel electrode, a common electrode and a passivation layer formed between the pixel electrode and the common electrode, and the pixel electrode is formed on the barrier layer.

In one example, the array substrate further comprises a barrier layer which is only formed on the active layer.

In one example, the array substrate further comprises a pixel electrode, a common electrode and a passivation layer formed between the pixel electrode and the common electrode, the pixel electrode is formed on the gate insulating layer, and the pixel electrode is electrically connected with the drain electrode.

In one example, the array substrate further comprises a gate line provided on the same layer with and formed synchronously with the gate electrode, and the protection layer is at least provided at the position where the data line and the gate line overlap each other.

In one example, the position of the protection layer corresponds to the position of the data line.

This embodiment achieves following advantageous effect: a protection layer is provided between and directly contacts the data line and the gate insulating layer, and the protection layer and the data line do not have the gap bubble therebetween and have strong anticorrosion ability, and during etching the data line, the data line is protected to avoid being corroded and then cracked; meanwhile, the material of the metal protection layer is ZnO, InZnO, ZnSnO, GaInZnO or ZrInZnO which softness is better than metal materials, and is not easily cracked at the gradient position, which helps to alleviate the cracking of the data line.

The embodiments of the present invention provide a display device comprising the above array substrate.

The embodiments of the present invention provide a manufacturing method of the array substrate, comprising:

providing a substrate with a gate electrode of a thin film field effect transistor formed on the substrate and a gate insulating layer formed on a first metal layer where the gate electrode is located;

on the substrate as provided, forming a thin film of a protection layer, and forming a pattern comprising the protection layer through a patterning process;

on the substrate formed with the protection layer, forming a thin film of a second metal layer, forming a pattern comprising data line through a patterning process, and the data line directly contacting the protection layer; and wherein, the active layer of the thin film field effect transistor is provided on the same layer with and has the same material with the protection layer, and the source electrode and the drain electrode of the thin film field effect transistor and the data line are provided on the same layer and are formed synchronously.

In one example, the thin film of the barrier layer is formed on the substrate formed with the second metal layer, and the pattern comprising the barrier layer is formed through a patterning process.

In one example, a first conductive film is formed on the substrate formed with the barrier layer, the pattern comprising the pixel electrode is formed through a patterning process, and the pixel electrode is electrically connected with the drain electrode;

forming a passivation layer on the substrate formed with the pixel electrode; and forming a second conductive film on the substrate formed with the passivation layer, and forming a pattern comprising the common electrode through a patterning process.

In one example, the gate line of the array substrate and the gate electrode are provided on the same layer and formed synchronously, and the protection layer is at least provided at the position where the data line and the gate line overlap each other.

The embodiments of the present invention achieve following advantageous effect: no barrier layer is provided between the data line and the gate insulating layer, while a protection layer is provided between and directly contacts the data line and the gate insulating layer, and the protection layer and the data line do not have the gap bubble therebetween and have strong anticorrosion ability, and during etching the data line, the data line is protected to avoid being corroded and then cracked; meanwhile, the material of the metal protection layer is ZnO, InZnO, ZnSnO, GaInZnO or ZrInZnO which softness is better than metal materials, and is not easily cracked at the gradient position, which helps to alleviate the cracking of the data line.

BRIEF DESCRIPTION OF THE DRAWINGS

In order to more clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical solutions and advantages of the embodiments of the invention more apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
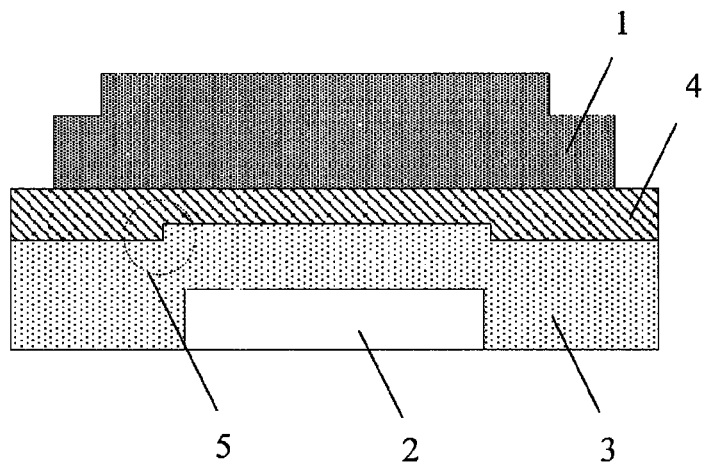
FIG. 1 is a schematic sectional diagram of an overlapping position of a data line and a gate line in an array substrate of the prior art.
Figure 2:
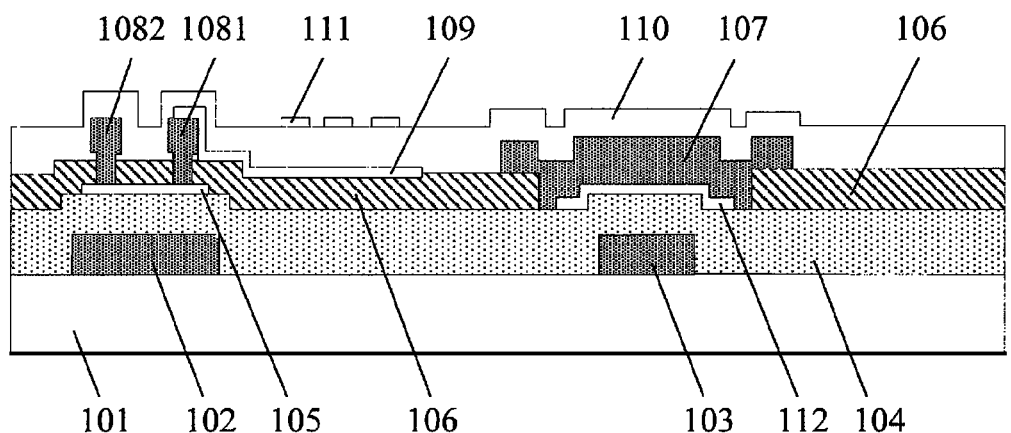
FIG. 2 is a schematic structural diagram of an array substrate according to embodiments of the present invention.

Referring to FIG. 2, the embodiments of the present invention provide an array substrate comprising a substrate 101 which is formed with a thin film field effect transistor (TFT) and a data line 107 thereon, and the TFT comprises a gate electrode 102, an active layer 105, a source electrode 1082 and a drain electrode 1081; a gate insulating layer 104 is formed between the gate electrode 102 and the active layer 105; and the array substrate comprises a protection layer 112 formed between the gate insulating layer 104 and the data line 107 and being in direct contact with the data line 107; and the protection layer 112 is provided on the same layer with and has the same material with the active layer 105. Of course, the area of the protection layer 112 is determined according to actual design needs to protect the data line.

For example, the material of the protection layer 112 is ZnO, InZnO, ZnSnO, GaInZnO or ZrInZnO.

For example, the thickness of the protection layer 112 is 200 Å-2000 Å.

The TFT in this embodiment is a bottom gate type TFT.

For example, the array substrate further comprises a barrier layer 106 formed on the active layer 105 and on the gate insulating layer 104 outside the protection layer 112. In this embodiment, the barrier layer 106 still covers part of the region of the gate insulating layer 104. The region of the barrier layer 106 corresponding to the region of the protection layer 112 is removed. Of course, in the situation of not considering the overall thickness of the array substrate or the uniformity between the thicknesses of the respective regions, the region of the barrier layer 106 corresponding to the region of the protection layer 112 can also be maintained.

For example, the array substrate comprises a pixel electrode 109, a common electrode 111 and a passivation layer 110 formed between the pixel electrode 109 and the common electrode 111. The pixel electrode 109 is formed on the barrier layer 106, and the pixel electrode 109 is electrically connected with the drain electrode 1081.

For example, the array substrate comprises a gate line 103 provided on the same layer with and formed synchronously with the gate electrode 102. The gate line 103 and the data line 107, for example, can be arranged crossing each other. The protection layer 112, for example, is at least provided at the position where the data line 103 and the gate line 107 overlap each other. As the insulating layer between the gate line and the data line has a height difference at the position where the gate line overlap the data line, thus, at least the protection layer provided at the position where the gate line 103 and the data line 107 overlap each other can prevent the data line from being eroded. However, the embodiments according to the present invention are not limited to this, and the position of the protection layer 112 can correspond to the position of the data line 107, that is, the protection layer can be provided below the entirety of the data line, thus the data line can be better protected.

For example, the protection layer 112 can be larger than the region where the gate line 103 and the data line 107 overlap each other so as to completely cover the steps rendered by the gate line in the insulating layer below the data line.

This embodiment achieves the following advantageous effects: a protection layer is provided between the data line and the gate insulating layer and directly contacts the data line. As the protection layer is made from a semiconductor material which is the same as the active layer, its density is larger than that of the gate insulating layer, and the protection layer and the data line do not have the gap bubble therebetween and have strong anticorrosion ability, and during etching the data line, the data line is protected to avoid being corroded and then cracked. Meanwhile, the material of the protection layer is ZnO, InZnO, ZnSnO, GaInZnO or ZrInZnO which softness is better than metal materials, and is not easily cracked at the slope position, which helps to alleviate the cracking of the data line.

Figure 3:
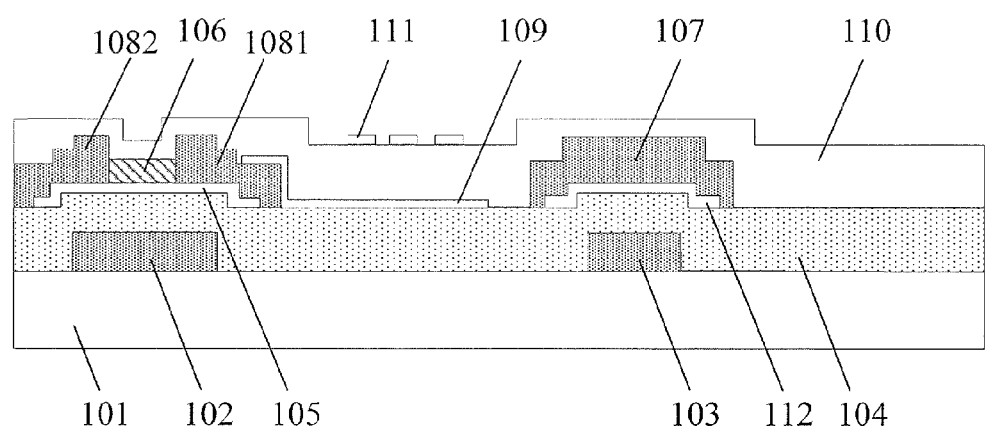
FIG. 3 is a schematic structural diagram of another array substrate according to embodiments of the present invention.

Referring to FIG. 3, the embodiments of the present invention provide another array substrate, and a bottom gate type TFT is still taken as an example for description. The array substrate comprises a substrate 101, and a gate electrode 102, a gate line 103, a gate insulating layer 104, an active layer 105, a data line 107, a source electrode 1082, a drain electrode 1081, a pixel electrode 109, a passivation layer 110 and a common electrode 111 are formed on the substrate; the gate line 103 and the data line 107 are arranged crossing each other and are located at different layers insulated from each other. The gate electrode 102, the active layer 105, the source electrode 1082 and the drain electrode 1081 constitute the TFT.

The array substrate comprises a protection layer 112 formed between the gate insulating layer 104 and the data line 107 and being in direct contact with the data line 107; and the protection layer 112 and the active layer 105 are provided on the same layer and have the same material. Being different from the above embodiment, the barrier layer 106 is only formed on the active layer 105 and is not provided in other regions, which helps to reduce the thickness of the array substrate. As the barrier layer 106 is only formed on the active layer 105, correspondingly, the pixel electrode is formed on the gate insulating layer.

This embodiment achieves the following advantageous effect: a protection layer is provided between the data line and the gate insulating layer and directly contacts the data line. As the protection layer is made from a semiconductor material which is the same as the active layer, its density is larger than that of the gate insulating layer, and the protection layer and the data line do not have the gap bubble therebetween and have strong anticorrosion ability. During etching the data line, the data line is protected to avoid being corroded and then cracked. Only forming the barrier layer on the active layer helps to reduce the thickness of the array substrate.

The above are just two preferable embodiments of the present invention, and the concept of the present invention is also applicable to a coplanar type TFT array substrate, a back channel etch type array substrate and a top gate type array substrate, which are not listed herein one by one.

The embodiments of the present invention provide a display device comprising the above array substrate.

The embodiments of the present invention provide a manufacturing method of the array substrate, comprising:

S101, providing a substrate with a gate electrode of a thin film field effect transistor formed on the substrate and a gate insulating layer formed on a first metal layer where the gate electrode is located;

S102, on the substrate as provided, forming a thin film of a protection layer, and faulting a pattern comprising the protection layer through a patterning process;

S103, on the substrate formed with the protection layer, forming a thin film of a second metal layer, forming a pattern comprising a data line through a patterning process, and the data line directly contacting the protection layer;

For example, the active layer of the thin film field effect transistor and the protection layer are provided on the same layer and have the same material, and the source electrode and the drain electrode of the thin film field effect transistor and the data line are provided on the same layer and formed synchronously.

For example, the method further comprises S104, forming a thin film of a barrier layer on the substrate formed with the second metal layer, and forming a pattern comprising the barrier layer through a patterning process;

For example, the method further comprises S105, forming a first conductive film on the substrate formed with the barrier layer, forming a pattern comprising the pixel electrode through a patterning process, and the pixel electrode being electrically connected with the drain electrode;

For example, the method further comprises S106, forming a passivation layer on the substrate formed with the pixel electrode; and For example, the method further comprises S107, forming a second conductive film on the substrate formed with the passivation layer, and forming a pattern comprising the common electrode through a patterning process.

For example, the gate line of the array substrate and the gate electrode are provided on the same layer and formed synchronously, and the position of the gate line corresponds to that of the protection layer.

The embodiments of the present invention achieve following advantageous effect: no barrier layer is provided between the data line and the gate insulating layer, while a protection layer is provided between and directly contacts the data line and the gate insulating layer, and during etching the data line, the protection layer protects the data line from being corroded and then cracked; meanwhile, the protection layer also helps to alleviate the cracking of the data line at the slope position.

The embodiments of the present invention provide a manufacturing method of the array substrate, comprising following steps:

Step 1, providing a substrate, depositing a first metal layer film on the substrate, and forming a pattern comprising a gate electrode and a gate line through one patterning process;

Step 2, forming a gate insulating layer on the substrate subjected to step 1;

Step 3, forming a thin film comprising an active layer and a protection layer on the substrate subjected to step 2, and forming a pattern comprising the active layer and the protection layer through a patterning process;

Step 4, forming a barrier layer on the substrate subjected to step 3;

Step 5, forming a second metal layer film on the substrate subjected to step 4, and forming a pattern comprising a source electrode, a drain electrode and a data line through one patterning process;

Step 6, forming a pixel electrode layer film on the substrate subjected to step 5, forming a pixel electrode through one patterning process, and the pixel electrode being electrically connected with the drain electrode;

Step 7, forming a passivation layer on the substrate subjected to step 6; and

Step 8, forming a transparent conductive layer film on the substrate subjected to step 7, and forming a pattern of a common electrode through one patterning process.

For example, in step 4, the barrier layer is formed on the active layer and on the gate insulating layer outside the protection layer; or, the barrier layer is only formed on the active layer.

For example, in step 3, the protection layer and the active layer are synchronously provided and formed.

For example, the protection layer is insulated from the active layer.

For example, the protection layer is ZnO, InZnO, ZnSnO, GaInZnO or ZrInZnO.

For example, the thickness of the protection layer is 200 Å-2000 Å.

Each of the patterning processes in this method, for example, comprises: steps of coating photoresist, exposing, developing, removing photoresist, and etc.

This embodiment achieves following advantageous effects: a protection layer is provided between the data line and the gate insulating layer and directly contacts the data line. As the protection layer is made from a semiconductor material which is the same as the active layer, its density is larger than that of the gate insulating layer, and the protection layer and the data line do not have the gap bubble therebetween and have strong anticorrosion ability, and during etching the data line, the data line is protected to avoid being corroded and then cracked; meanwhile, the material of the protection layer is ZnO, InZnO, ZnSnO, GaInZnO or ZrInZnO which softness is better than metal materials, and is not easily cracked at the slope position, which helps to alleviate the cracking of the data line.

Although description is made taking the structure as an example that a pixel electrode and a common electrode are provided on the array substrate, the embodiments of the present invention are not limited to this, and the array substrate may not be provided with the common electrode. The array substrate according to the embodiments of the present invention can be used in a liquid crystal display panel, an organic light emitting display panel and etc.

Described above are just exemplary ones of the present invention, and are not intended to limit the scope of protection of the invention. The scope of protection of the present invention shall be defined by the appended claims.

The invention claimed is:

1. An array substrate comprising a substrate and a thin film field effect transistor and a data line formed on the substrate, the thin film field effect transistor comprising a gate electrode, an active layer, a source electrode and a drain electrode, and a gate insulating layer being formed between the gate electrode and the active layer;

wherein the array substrate further comprises: a protection layer formed between the gate insulating layer and the data line and being in direct contact with the data line; and the protection layer is provided on the same layer with and has the same material as the active layer; and a barrier layer formed on the active layer and on the gate insulating layer outside the protection layer, wherein, the active layer is covered by the barrier layer, and the source electrode and the drain electrode are in physical contact with the active layer through via holes in the barrier layer.

2. The array substrate according to claim 1, wherein, the protection layer has a thickness of 200 Å-2000 Å.

3. The array substrate according to claim 1, wherein, the thin film field effect transistor is a bottom gate type thin film field effect transistor.

4. The array substrate according to claim 1, further comprising a pixel electrode, a common electrode and a passivation layer formed between the pixel electrode and the common electrode, the pixel electrode being formed on the barrier layer, and the pixel electrode being electrically connected with the drain electrode.

5. The array substrate according to claim 1, further comprising a gate line provided on the same layer with and formed synchronously with the gate electrode, and the protection layer is at least provided at a position where the data line and the gate line overlap each other in a direction along a thickness of the substrate; and a size of the protection layer is larger than a size of the gate line perpendicular to a direction along which the data line extends.

6. The array substrate according to claim 5, wherein, the protection layer has a position corresponding to that of the data line.

7. A display device comprising the array substrate according to claim 1.

8. The array substrate according to claim 1, wherein, the protection layer has a material of ZnO, InZnO, ZnSnO, GaInZnO or ZrInZnO.

9. The array substrate according to claim 8, wherein, the protection layer has a thickness of 200 Å-2000 Å.

10. The array substrate according to claim 8, wherein, the thin film field effect transistor is a bottom gate type thin film field effect transistor.

11. The array substrate according to claim 8, further comprising a gate line provided on the same layer with and formed synchronously with the gate electrode, and the protection layer is at least provided at a position where the data line and the gate line overlap each other in a direction along a thickness of the substrate.

12. A manufacturing method of the array substrate according to claim 1, comprising:

providing the substrate with the gate electrode of the thin film field effect transistor formed on the substrate and the gate insulating layer formed on a first metal layer where the gate electrode is located;

forming a thin film of the protection layer on the substrate, and forming a pattern comprising the protection layer through a patterning process;

forming a thin film of a second metal layer on the substrate formed with the protection layer, forming a pattern comprising the data line through a patterning process, and the data line directly contacting the protection layer;

wherein, the active layer of the thin film field effect transistor is provided on the same layer with and has the same material with the protection layer, and the source electrode and the drain electrode of the thin film field effect transistor and the data line are provided on the same layer and are formed synchronously.

13. The method according to claim 12, further comprising:

forming a thin film of the barrier layer on the substrate formed with the second metal layer, and forming a pattern comprising the barrier layer through a patterning process.

14. The method according to claim 13, further comprising:

forming a first conductive film on the substrate formed with the barrier layer, forming a pattern comprising a pixel electrode through a patterning process, and the pixel electrode being electrically connected with the drain electrode;

forming a passivation layer on the substrate formed with the pixel electrode; and forming a second conductive film on the substrate formed with the passivation layer, and forming a pattern comprising a common electrode through a patterning process.

15. The method according to claim 12, wherein, a gate line of the array substrate and the gate electrode are provided on the same layer and formed synchronously, and the protection layer is at least provided at a position where the data line and the gate line overlap each other.

* * * * *